(12) United States Patent
Ogasawara

(10) Patent No.: US 7,692,158 B2
(45) Date of Patent: Apr. 6, 2010

(54) CHARGED BEAM DRAWING APPARATUS

(75) Inventor: Munehiro Ogasawara, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 299 days.

(21) Appl. No.: 11/710,930

(22) Filed: Feb. 27, 2007

(65) Prior Publication Data
US 2007/0228297 A1 Oct. 4, 2007

(30) Foreign Application Priority Data
Mar. 31, 2006 (JP) ............... 2006-099133

(51) Int. Cl.
G21K 1/08 (2006.01)
H01J 1/00 (2006.01)

(52) U.S. Cl. ............... 250/396 R; 250/492.1; 250/492.2; 250/492.21; 250/492.3

(58) Field of Classification Search ............... 250/398, 250/396 R, 397, 399, 492.1, 492.2, 492.22, 250/492.3, 400, 396 ML, 491.1, 492.23, 250/492.21; 430/296, 297, 298, 299; 204/157.44, 204/411, 412, 416; 216/62, 66, 67, 87, 94; 315/7

See application file for complete search history.

(56) References Cited

U.S. PATENT DOCUMENTS

| | | | | |
|---|---|---|---|---|
| 5,153,901 | A * | 10/1992 | Shoulders | 378/119 |
| 5,208,560 | A * | 5/1993 | Yasutake | 333/12 |
| 6,055,719 | A * | 5/2000 | Ooaeh et al. | 29/592.1 |
| 6,522,301 | B2 | 2/2003 | Takayama et al. | |
| 7,186,943 | B2 | 3/2007 | Hoffman et al. | |
| 7,227,155 | B2 * | 6/2007 | Buller et al. | 250/396 R |
| 7,439,502 | B2 | 10/2008 | Nakasuji et al. | |
| 2005/0016755 | A1 | 1/2005 | Martinez et al. | |
| 2008/0015570 | A1 | 1/2008 | Ormsby et al. | |
| 2008/0231192 | A1 | 9/2008 | Ogasawara et al. | |

FOREIGN PATENT DOCUMENTS

JP 62-119845 6/1987

(Continued)

OTHER PUBLICATIONS

Ogasawara, et al., "Development of a Fast Beam-Blanking System", Part of the SPIE Conference on Photomask and X-Ray Mask Technology V, Kawasaki, Japan, SPIE vol. 3412, pp. 79-85, (Apr. 1998).

Primary Examiner—Jack I Berman
Assistant Examiner—Nicole Ippolito Rausch
(74) Attorney, Agent, or Firm—Finnegan, Henderson, Farabow, Garrett & Dunner, L.L.P.

(57) ABSTRACT

A charged beam drawing apparatus deflects, by an electrostatic deflector, a charged beam generated from a charged beam source, and applies the charged beam to a desired position on a sample to draw a pattern. The electrostatic deflector includes a plurality of deflecting electrodes arranged symmetrically with respect to a point around an optical axis of the charged beam, a ground external cylinder which is disposed coaxially with the optical axis and which is provided to enclose the deflecting electrodes, a resistive film provided on an inner surface of the ground external cylinder, and a conductive film provided on a surface of the resistive film. A capacitance is formed between the deflecting electrodes and the conductive film, and a resistance is formed between the ground conductor and the conductive film.

14 Claims, 4 Drawing Sheets

FOREIGN PATENT DOCUMENTS

| | | |
|---|---|---|
| JP | 63-2239 | 1/1988 |
| JP | 63-136449 | 6/1988 |
| JP | 6-7466 | 1/1994 |
| JP | 7-104098 | 4/1995 |
| JP | 9-134869 | 5/1997 |
| JP | 11-150055 | 6/1999 |
| JP | 11-176719 | 7/1999 |
| JP | 11-273603 | 10/1999 |
| JP | 2002-100317 | 4/2002 |
| JP | 2007-48806 | 2/2007 |

* cited by examiner

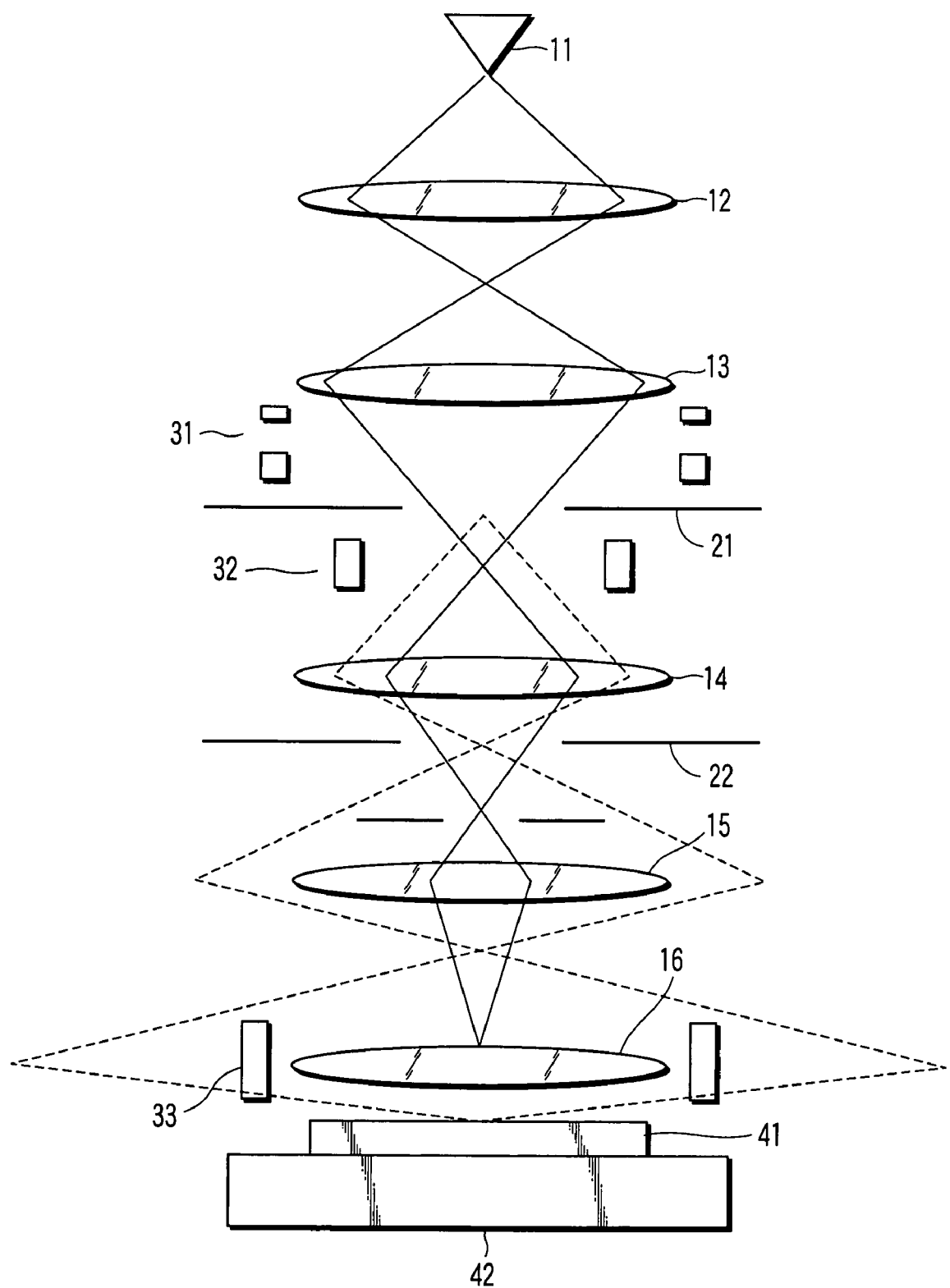
F I G. 1

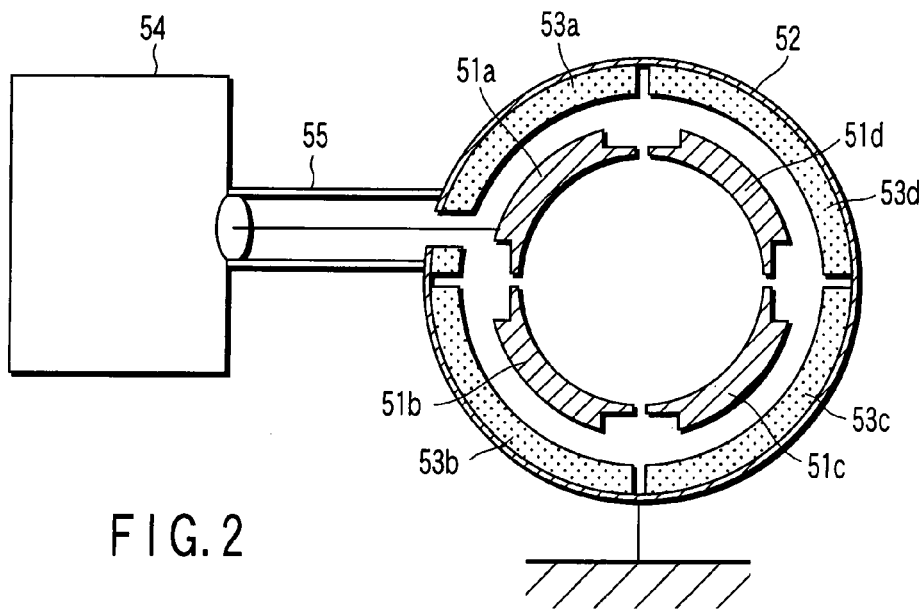
F I G. 2
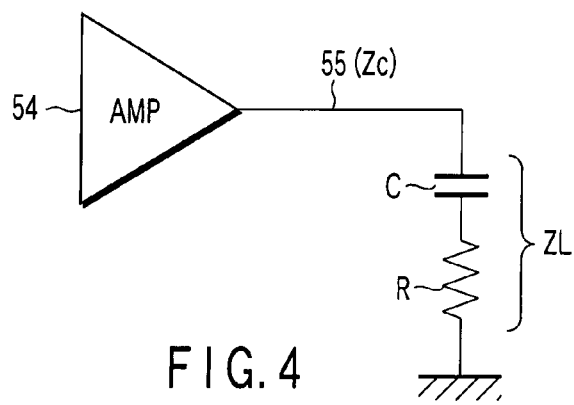
F I G. 4
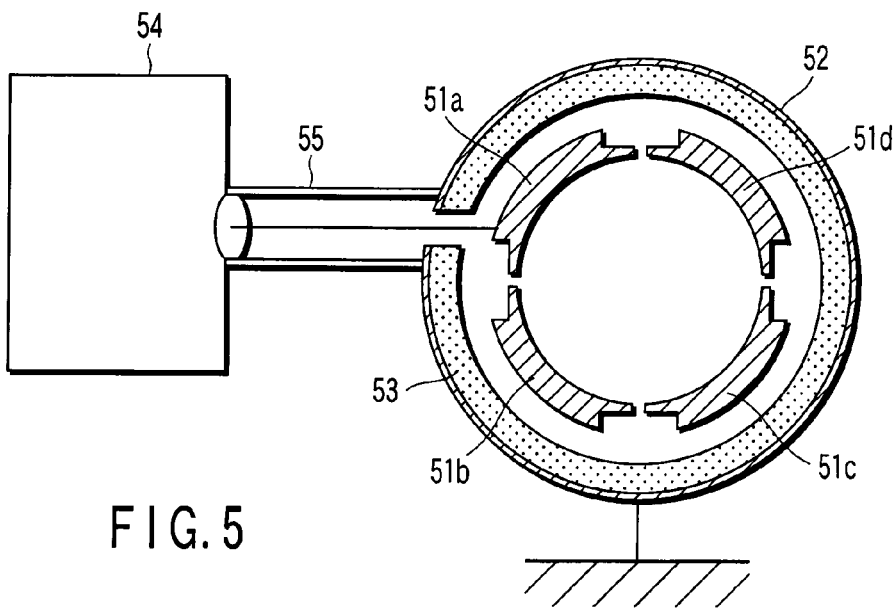
F I G. 5

CHARGED BEAM DRAWING APPARATUS

CROSS-REFERENCE TO RELATED APPLICATIONS

This application is based upon and claims the benefit of priority from prior Japanese Patent Application No. 2006-099133, filed Mar. 31, 2006, the entire contents of which are incorporated herein by reference.

BACKGROUND OF THE INVENTION

1. Field of the Invention

The present invention relates to a charged beam drawing apparatus for drawing an LSI pattern by use of a charged beam.

2. Description of the Related Art

In an electron beam drawing apparatus, various kinds of electrostatic deflectors are used, such as a blanking deflector, a shaping deflector and an objective deflector. The electrostatic deflector has a plurality of deflecting electrodes, and gives a potential generated by a deflection amplifier to each of the electrodes, thereby deflecting an electron beam by an electric field generated between the electrodes.

One end of a coaxial cable is connected to an output end of the deflection amplifier, and the other end of the coaxial cable is connected to the deflecting electrodes of the electrostatic deflector. In general, since the deflecting electrodes of the electrostatic deflector are electrically connected to the coaxial cable alone, it is possible to consider that a capacity load is added to the end of the coaxial cable in terms of an equivalent circuit. Thus, a signal input from the deflection amplifier is substantially totally reflected by the deflecting electrodes, and the input signal returns to the deflection amplifier with a delay of a given time corresponding to the length of the coaxial cable. In such a state, high-speed operation of the deflection amplifier is difficult.

On the other hand, if the deflecting electrodes are connected to a ground via a resistance equivalent to a characteristic impedance of the coaxial cable, the reflection of the signal by the deflecting electrodes is suppressed, such that a high-speed operation can be performed (JP-A 11-150055 (KOKAI)). However, in this case, since there is a current running to the resistance even if a voltage is in a constant state, a load on the deflection amplifier is increased. Therefore, it is difficult to raise a driving voltage. For example, given that 50Ω is used in a terminating resistance and that a voltage of 50V is applied thereto, a current of 1 A steadily flows at the maximum in the terminating resistance. This is not realistic because loads on the amplifier, the cable and the terminating resistance are heavy.

Thus, in the conventional electron beam drawing apparatus, it has been difficult to achieve high-speed high-voltage operation of the electrostatic deflector without increasing the load on the deflection amplifier. Moreover, the problem described above is true with not only the electron beam drawing apparatus but also an ion beam drawing apparatus.

BRIEF SUMMARY OF THE INVENTION

According to an aspect of the present invention, there is provided a charged beam drawing apparatus comprising:
a charged beam source which generates a charged beam;
an electrostatic deflector provided on a downstream side of the charged beam source to apply a charged beam to a desired position on a sample, the electrostatic deflector including a plurality of deflecting electrodes insulated from a ground plane with respect to a direct current to deflect the charged beam by an electric field and, a capacitance and an electric resistance arranged in series between the deflecting electrodes of the electrostatic deflector and the ground plane.

BRIEF DESCRIPTION OF THE SEVERAL VIEWS OF THE DRAWING

FIG. 1 is a schematic configuration diagram showing an electron beam drawing apparatus according to a first embodiment;

FIG. 2 is a sectional view showing a shaping deflector used in the first embodiment cut in a direction perpendicular to an optical axis direction;

FIG. 4 is an equivalent circuit diagram showing how the deflector in the first embodiment is connected to a deflection amplifier;

FIG. 5 is a sectional view showing a modification of the first embodiment;

DETAILED DESCRIPTION OF THE INVENTION

Figure 3:
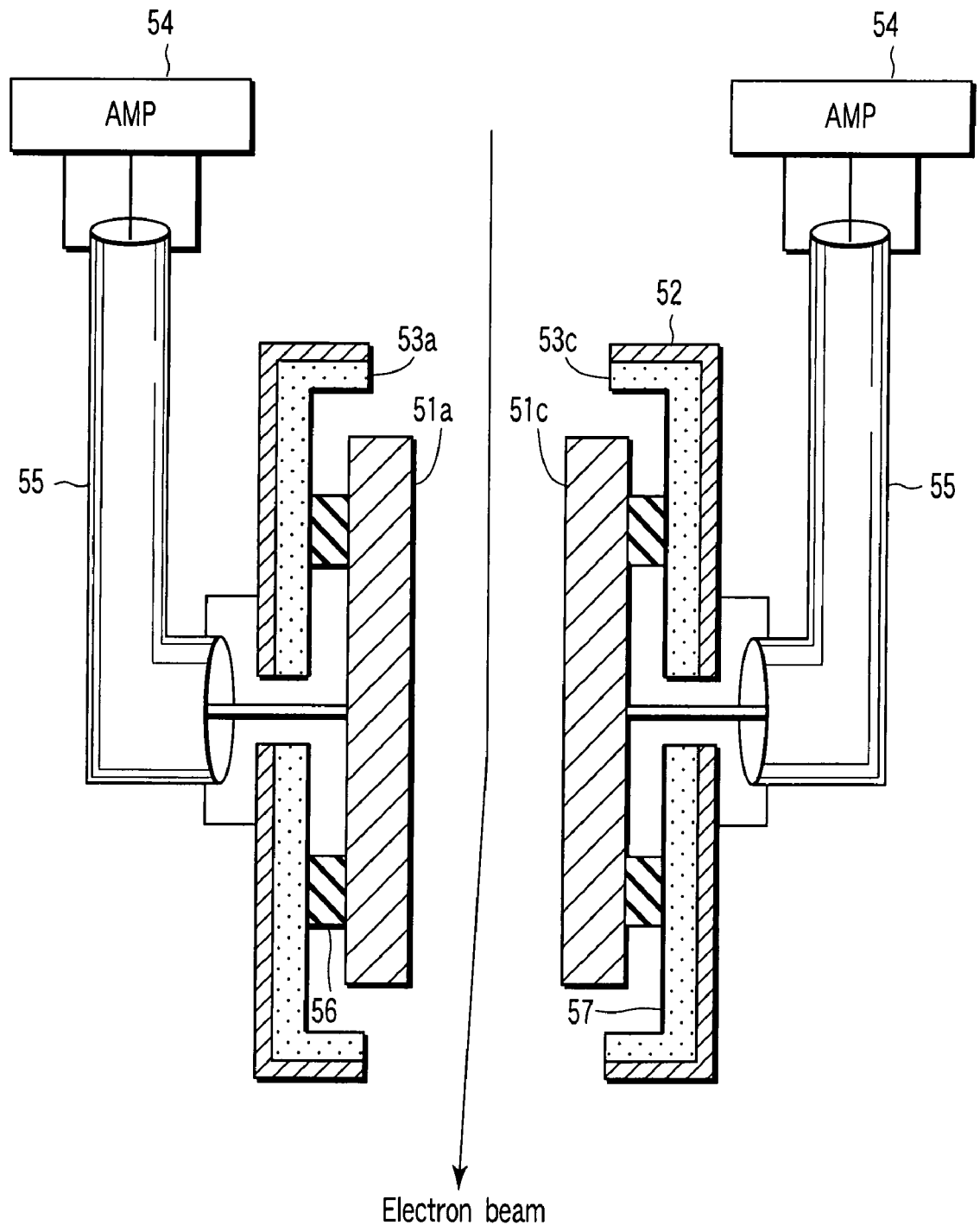
FIG. 3 is a sectional view showing the shaping deflector used in the first embodiment cut along the optical axis direction.

Details of the present invention will hereinafter be described in accordance with shown embodiments.

First Embodiment

There will be described an electron beam drawing apparatus according to a first embodiment referring to FIG. 1.

In the drawing, 11 denotes an electron gun (charged beam source) for generating an electron beam, 12 and 13 denote condenser lenses, 14 denotes a projection lens, 15 denotes a reducing lens, 16 denotes an objective lens, 21 denotes a first shaping aperture mask, 22 denotes a second shaping aperture mask, 31 denotes a blanking deflector for turning on/off the beam, 32 denotes a shaping deflector for varying the dimensions and shape of the beam, 33 denotes an objective deflector for scanning with the beam on a sample surface, 41 denotes a sample such as a mask or wafer, and 42 denotes a sample stage. In addition, although not shown in the drawing, the electron gun 11, the various lenses 12 to 16, the aperture masks 21 and 22, and the various deflectors 31 to 33 are housed in an electronic optical column.

The electron beam emitted from the electron gun 11 at an accelerating voltage of 50 kV is focused by the condenser lenses 12 and 13 excited so that a crossover image coincides with a deflection fixed point of the shaping deflector 32, and the electron beam is applied to the first shaping aperture mask 21. The first shaping aperture mask 21 is provided with a rectangular opening, and the electron beam transmitted through this opening has a rectangular sectional shape. The electron beam formed into the rectangular shape by the first shaping aperture mask 21 is then focused by the projection lens 14 excited so that an image in the first shaping aperture mask 21 is formed on the second shaping aperture mask 22, and the electron beam is applied to the second shaping aperture mask 22.

Here, the position for the beam application on the second shaping aperture mask 22 can be changed by the shaping deflector 32. Openings with various shapes are provided on the second shaping aperture mask 22, and the beam can be transmitted through a desired position in the second shaping aperture mask 22 to obtain an electron beam having a desired sectional shape.

The electron beam transmitted through the second shaping aperture mask 22 is focused by the reducing lens 15 and the objective lens 16, and reaches the surface of the sample 41 mounted on the stage 42. At this moment, the electron beam is deflected by the objective deflector 33, and thus reaches a desired position on the sample 41.

Here, an electrostatic deflector comprising a plurality of deflecting electrodes is used for the deflector 31, 32, 33. These deflectors apply a potential generated by a deflection amplifier to the deflecting electrodes to deflect the electron beam by an electric field generated between the electrodes.

FIGS. 2 and 3 are diagrams showing a specific configuration of the shaping deflector 32 used in the present embodiment. FIG. 2 shows a section of the shaping deflector 32 cut vertically to a beam moving direction, and FIG. 3 shows a section of the shaping deflector 32 cut along the beam moving direction. By way of example, the number of deflecting electrodes is four. Here, an example of the shaping deflector 32 is described as the electrostatic deflector, but the objective deflector 33 can be configured in the same manner.

The shaping deflector 32 comprises four deflecting electrodes 51 (51a, 51b, 51c and 51d). That is, the deflecting electrodes 51a and 51c are oppositely arranged across a beam axis, and, for example, a deflecting voltage in an x direction is applied across these deflecting electrodes. The deflecting electrodes 51b and 51d are oppositely arranged across the beam axis, and, for example, a deflecting voltage in a y direction is applied across these deflecting electrodes.

The four deflecting electrodes 51 are concentrically and circularly arranged inside a ground external cylinder 52 disposed coaxially with an optical axis. Each of the deflecting electrodes 51 is made of a plate member, and curved along a concentric circle around the beam axis. That is, a section in a direction perpendicular to the beam axis is formed into an arc shape. Further, portions of the deflecting electrodes 51 adjacent to each other are thin, so that the capacitance between the adjacent deflecting electrodes is small. Resistors 53 (53a, 53b, 53c and 53d) are arranged between the deflecting electrodes 51 and the ground external cylinder 52. The resistors 53 are films of, for example, silicon carbide.

A deflection amplifier 54 is connected to each of the four deflecting electrodes 51 by a coaxial cable 55, but one connection is only shown in FIG. 2, and two connections are only shown in FIG. 3. A characteristic impedance Zc of the coaxial cable 55 is 50Ω in the description. It is also possible to use a cable with a Zc of 75Ω or a higher value. The present drawings are schematic, and do not precisely reproduce an actual structure and dimensions.

The shaping deflector 32 is made up of, from the inside, the deflecting electrodes 51, a space, the resistors 53 and the ground external cylinder 52. Therefore, a capacitance and an electric resistance are connected in series between the deflecting electrodes 51 and the ground external cylinder 52, and an equivalent circuit is as shown in FIG. 4.

The resistors 53 are desirably divided as many as the number of deflecting electrodes 51, but may have an integral structure as shown in FIG. 5 when a decrease in characteristics can be permitted. The resistors 53 are electrically insulated from the deflecting electrodes 51. In order to maintain this insulating structure, the resistors 53 are actually insulated from by an insulator sufficiently smaller than the structure of the electrodes. Strictly speaking, a value of resistance between the deflecting electrodes 51 and the resistors 53 is limited even when they are connected by the insulator. However, anything can be regarded as an insulator as long as it has a value sufficiently greater than that of the resistance of the resistors 53. For example, 1 MΩ or more is generally sufficient. In addition, although not shown in FIG. 2, insulators 56 are provided in parts between the resistors 53 and the deflecting electrodes 51 to mechanically hold the deflecting electrodes 51. Moreover, inner surfaces of the resistors 53 are coated with good conductors 57 such as copper.

In this structure, a value R of resistance between the ground external cylinder 52 and the inner conductors 57 of the resistors 53 is substantially equal to the value of the characteristic impedance Zc of the coaxial cable 55. In this example, the value is decided to be 50Ω. A length L of the deflecting electrodes 51 in an optical axis direction is 120 mm, an outside diameter 2 r of a cylinder made up of the four deflecting electrodes is 20 mm. Moreover, the distance between the deflecting electrodes 51 and the inner conductive surfaces of the resistors 53 is 0.6 mm. A capacitance C in this case is approximately as follows:

$$C \sim \epsilon_0 \times 2\pi \times r \times L/4d \sim 28 pF$$

wherein $\epsilon_0$ is a dielectric constant in a vacuum. This value is sufficiently greater than an interelectrode capacitance between the adjacent deflecting electrodes.

At this point, when a value R of resistance between the inner conductors 57 of the resistors 53 and the ground external cylinder 52 is 50Ω, a time constant when viewed from the outside of the deflecting electrodes 51 is about 1.4 ns. A time constant of 1.4 ns is shorter than a beam setting time of an ordinary deflection amplifier, and therefore, no response delay is caused by this time constant. Since the insulators 56 between the resistors 53 and the deflecting electrodes 51 function to increase the capacitance, it is desirable that the outside diameter of the deflecting electrodes 51 be actually slightly decreased so that the capacity is not greater than the above-mentioned value.

Now, silicon carbide with a resistivity of $10^5$ Ωcm is used as the resistors 53, and the inside diameter thereof is set at 21.2 mm and the thickness thereof is set at 2 mm, such that a resistance value in the direction perpendicular to the beam axis can be about 50Ω. The resistors 53 are fixed in close contact with the ground external cylinder 52 to minimize a contact resistance. Proper holes are opened in the ground external cylinder 52 and the resistors 53 to apply a voltage to the deflecting electrodes 51, and a core wire of the coaxial cable 55 is connected to the deflecting electrodes 51 through the holes. If the thickness at the end of the deflecting electrode 51 in a circumferential angle direction is 1 mm, the mutual capacitance between the adjacent electrodes is about 1 pF when the distance between the adjacent electrodes is 1 mm, so that the mutual capacitance can be sufficiently smaller than the capacitance between the deflecting electrodes 51 and the resistors 53.

Figure 6A:
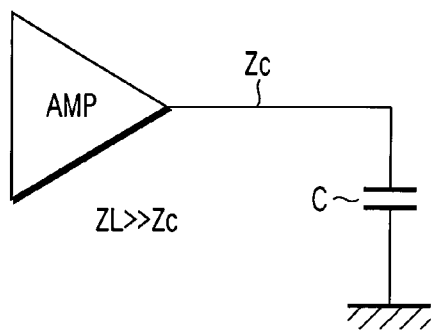
FIGS. 6A and 6B are schematic diagrams explaining a function of the first embodiment and showing a change of impedance in a lower frequency region and a high frequency region.
Figure 6B:
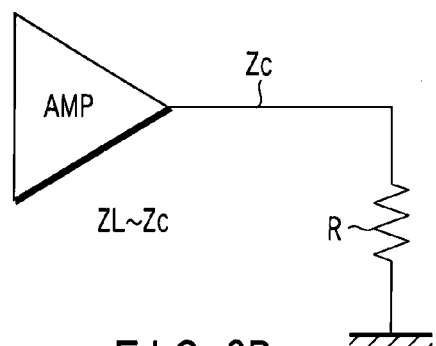

FIGS. 6A and 6B are diagrams conceptually showing electric properties of the shaping deflector 32 when configured as described above. As shown in FIG. 6A, an absolute value of a complex impedance ZL of the shaping deflector 32 is $|-i/(C\omega)+R|=5.7$ kΩ in a region at a comparatively low frequency of, for example, 1 MHz, so that a current can be held down to about 10 mA in amplitude with respect to a sinusoidal voltage having an amplitude of 50V. On the other hand, as shown in FIG. 6B, the absolute value is about 50Ω in a region with a comparatively high frequency of, for example, 1 GHz, and a voltage reflectance in the shaping deflector 32 is 0.06 or less, which is low. That is, a state with little reflection can be achieved in the high frequency region. If the time constant is 1.4 ns, time to reach (1 to one ten-thousandth) X [v] from 0 [v] is about 13 ns with respect to a step input from 0 [v] to X [v]. That is, extremely rapid rising of the voltage is possible.

The lower limit of the time constant may be determined within a range that is permissible in light of the required accuracy. For example, when the time constant is 1/14 to 1/10 of the required rise time, the effect which the capacity may have on the pulse rise delay can be controlled to be 1 ppm to 50 ppm.

Thus, according to the present embodiment, the deflecting electrodes 51 of the shaping deflector 32 are connected with the ground external cylinder 52 via the electric resistance comprising the resistors 53 and via the capacitance, and the resistance value of the resistors 53 is substantially equal to the value of the characteristic impedance of the coaxial cable 55 connected to apply a voltage to the deflecting electrodes 51. Thus, an impedance-matched state is approached in the high frequency region while a state insulated from a ground plane is maintained with regard to a direct current, such that the reflection of the signal can be suppressed. In this manner, influence of a reflected wave on the deflection amplifier 54 for driving the shaping deflector 32 is reduced in the high frequency region, and the shaping deflector 32 can be operated at a high speed and at a high voltage. That is, a high-speed high-voltage operation of the shaping deflector 32 can be achieved without increasing a load on the deflection amplifier 54, such that a drawing speed can be improved.

Second Embodiment

Figure 7:
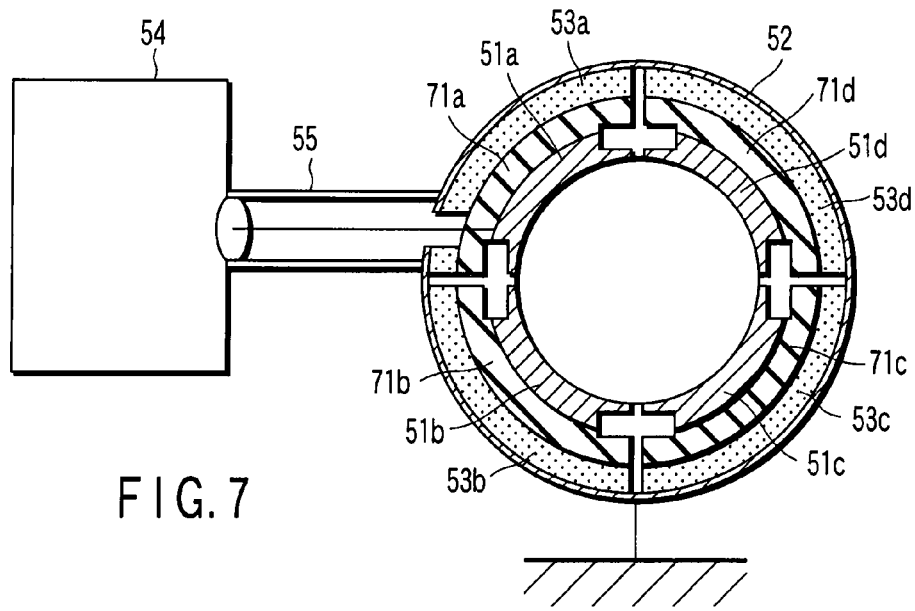
FIG. 7 is a sectional view showing a shaping deflector used in a second embodiment cut in a direction perpendicular to an optical axis direction.

There will be described an example of a shaping deflector used in an electron beam drawing apparatus according to a second embodiment in conjunction with FIG. 7. It is to be noted that the same numerals are assigned to the same parts as those in FIG. 2, and these parts are not described in detail.

The present embodiment is different from the first embodiment described above in that high dielectrics 71 (71a, 71b, 71c and 71d) which are insulators are inserted between deflecting electrodes 51 of a shaping deflector 32 and resistors 53. For example, alumina can be used as the high dielectrics 71. Here, strictly speaking, the resistance of the high dielectrics 71 is limited, but sufficiently greater than the resistance of the resistors 53, so that the high dielectrics 71 can be regarded as insulators. By the provision of the high dielectrics 71, the capacitance can be increased if the distance between the resistors 53 and the deflecting electrodes 51 is the same, and the distance between the resistors 53 and the deflecting electrodes 51 can be longer if the capacitance is the same.

In such a configuration, effects similar to those in the first embodiment described above can naturally be obtained, and the distance between the deflecting electrodes 51 and the resistors 53 can be wider than that in the example of FIG. 2, thereby providing an advantage of easier machining and assembly.

Third Embodiment

Figure 8:
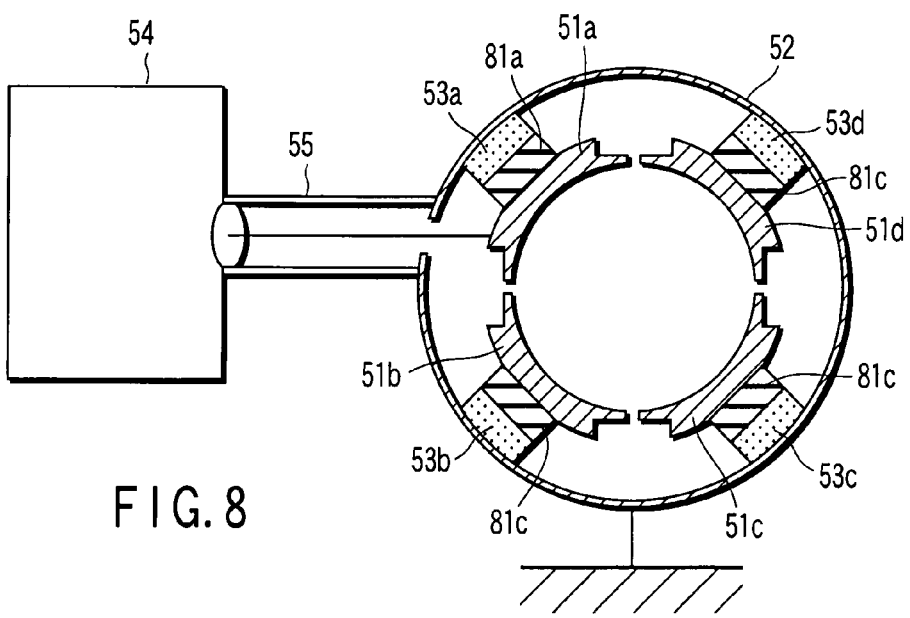
FIG. 8 is a sectional view showing a shaping deflector used in a third embodiment cut in a direction perpendicular to an optical axis direction.

There will be described an example of a shaping deflector used in an electron beam drawing apparatus according to a third embodiment referring to FIG. 8. It is to be noted that the same numerals are assigned to the same parts as those in FIG. 2, and these parts are not described in detail.

The present embodiment is different from the first embodiment described above in that dielectrics 81 (81a, 81b, 81c and 81d) are inserted between deflecting electrodes 51 of a shaping deflector 32 and resistors 53, and in that the dielectrics 81 and the resistors 53 are in an integral rod (rectangular parallelepiped) shape rather than a plate shape. Then, the resistors 53 and the dielectrics 81 integrally support the deflecting electrodes 51.

In the present embodiment again, a material and a shape are decided so that a resistance value R of the resistors 53 may be 50Ω. For example, given a square whose section is 2 cm long on a side, a pipe-shaped material having therein a square hole 1 cm long on a side, and a resistivity of 100 Ωcm, the length necessary for the resistors 53 is 1.5 cm. Further, screws formed of an insulating material can be let through the holes in the rectangular parallelepiped material and the dielectric material to fix the deflecting electrodes 51 to a ground external cylinder 52.

In such a configuration, effects similar to those in the first embodiment described above can naturally be obtained, and the deflecting electrodes 51 can simply be screwed to the ground external cylinder 52 through the holes in the dielectrics 81 and the resistors 53, thereby providing an advantage of easier machining and assembly.

MODIFICATION

It is to be noted that the present invention is not limited to the embodiments described above. The deflecting electrodes are in a shape along the arc around the beam axis in the embodiments, but the deflecting electrodes do not necessarily have to be arc-shaped and may be plate-shaped electrodes. Moreover, the number of deflecting electrodes is not in the least limited to four, and may be two or eight.

Furthermore, the ground external cylinder is provided in the electronic optical column in the present embodiments, but the ground external cylinder can be omitted. In this case, the electronic optical column itself may be used as the ground plane. Moreover, the electron beam drawing apparatus has been described by way of example in the embodiments, but it should be understood that the present invention can also be applied to an ion beam drawing apparatus which electrostatically deflects a beam.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A charged beam drawing apparatus comprising:
a charged beam source which generates a charged beam;
an electrostatic deflector provided on a downstream side of the charged beam source to apply the charged beam to a desired position on a sample, the electrostatic deflector including a plurality of deflecting electrodes insulated from a ground plane with respect to a direct current to deflect the charged beam by an electric field generated between the deflecting electrodes and, a capacitance and an electric resistance arranged in series between the deflecting electrodes and the ground plane;

a deflection amplifier to apply a potential to each of the deflecting electrodes to generate the electric field between the deflecting electrodes; and a coaxial cable connecting the electrostatic deflector to an output end of the deflection amplifier, a value of the electric resistance being substantially equal to a characteristic impedance of the coaxial cable.

2. The apparatus according to claim 1, further comprising dielectrics arranged between the deflecting electrodes and the ground plane to form the capacitance therebetween and support mechanically the deflecting electrodes.

3. The apparatus according to claim 1, wherein a time constant decided by a product of a value of the capacitance and the value of the electric resistance is shorter than a setting time of the deflection amplifier.

4. The apparatus according to claim 1, wherein a value of the capacitance between the deflecting electrodes and the ground plane is greater than a value of a capacitance between adjacent ones of the deflecting electrodes.

5. The apparatus according to claim 1, wherein the electrostatic deflector comprises a shaping deflector which varies a dimension and a shape of the charged beam.

6. A charged beam drawing apparatus comprising:
a charged beam source which generates a charged beam;
an electrostatic deflector provided on a downstream side of the charged beam source to deflect the charged beam by an electric field, the electrostatic deflector comprising:
   a plurality of deflecting electrodes arranged symmetrically with respect to a point around an optical axis of the charged beam,
   a ground external cylinder which is disposed coaxially with the optical axis and which is provided to enclose the deflecting electrodes,
   a resistive film provided on an inner surface of the ground external cylinder, and
   a conductive film provided on a surface of the resistive film, wherein a capacitance is formed between the deflecting electrodes and the conductive film, and an electric resistance is made of the resistive film between the ground external cylinder and the conductive film;
a deflection amplifier to apply a potential to each of the deflecting electrodes to generate the electric field between the deflecting electrodes; and
a coaxial cable connecting the electrostatic deflector to an output end of the deflection amplifier, a value of the electric resistance being substantially equal to a characteristic impedance of the coaxial cable.

7. The apparatus according to claim 6, further comprising dielectrics arranged between the deflecting electrodes and the conductive film to form the capacitance therebetween and to mechanically support the deflecting electrodes.

8. The apparatus according to claim 6, wherein a time constant decided by a product of a value of the capacitance and the value of the electric resistance is shorter than a setting time of the deflection amplifier.

9. The apparatus according to claim 6, wherein a value of the capacitance between the deflecting electrodes and the conductive film is greater than a value of a capacitance between adjacent ones of the deflecting electrodes.

10. The apparatus according to claim 6, wherein the electrostatic deflector comprises a shaping deflector which varies a dimension and a shape of the charged beam.

11. An electron beam drawing apparatus comprising:
an electron gun which generates an electron beam;
an electron lens provided on a downstream side of the electron gun to focus the electron beam;
an electrostatic deflector provided on the downstream side of the electron gun to deflect the electron beam by an electric field, the electrostatic deflector comprising:
   a plurality of deflecting electrodes arranged symmetrically with respect to a point around an optical axis of the electron beam,
   a ground external cylinder disposed coaxially with the optical axis and provided to enclose the deflecting electrodes,
   resistive films provided on an inner surface of the ground external cylinder to face the deflecting electrodes,
   conductive films provided on surfaces of the resistive films, and
   dielectric films inserted between the conductive films and the deflecting electrodes to mechanically support the deflecting electrodes,
   wherein a capacitance is formed by the dielectric films between the deflecting electrodes and the conductive films, and an electric resistance is formed by the resistive films between the ground external cylinder and the conductive films;
a deflection amplifier to apply a potential to each of the deflecting electrodes to generate the electric field between the deflecting electrodes; and
a coaxial cable connecting the electrostatic deflector to an output end of the deflection amplifier, a value of the electric resistance being substantially equal to a characteristic impedance of the coaxial cable.

12. The apparatus according to claim 11, wherein a time constant decided by a product of a value of the capacitance and the value of the electric resistance is shorter than a setting time of the deflection amplifier.

13. The apparatus according to claim 11, wherein a value of the capacitance between the deflecting electrodes and the conductive films is greater than a value of a capacitance between adjacent ones of the deflecting electrodes.

14. The apparatus according to claim 11, wherein the electrostatic deflector comprises a shaping deflector which varies a dimension and a shape of the electron beam.

* * * * *